July 9, 1963 J. S. HOCHHEISER 3,097,032

PIN SOCKET FOR MINIATURE ELECTRICAL COMPONENTS

Filed Nov. 28, 1961

INVENTOR.
JEROME S. HOCHHEISER
BY Wade Koontz
Louis E. Hay
ATTORNEYS

3,097,032
PIN SOCKET FOR MINIATURE ELECTRICAL COMPONENTS

Jerome S. Hochheiser, Northridge, Calif., assignor to the United States of America as represented by the Secretary of the Air Force Filed Nov. 28, 1961, Ser. No. 155,515
1 Claim. (Cl. 339—17)

This invention relates to pin sockets or connectors used to receive and hold various electrical components having pin connectors or the like. More particularly, this invention relates to miniaturized components as used with printed circuits.

Of necessity, it is imperative that in spite of their small size, sockets used with miniaturized electrical components must provide a firm mechanical and electrical connection and remain reliable during repeated connects and disconnects.

One embodiment of this invention which will be shown and described is particularly useful in applications where it is required to connect electronic modules having fixed pins directly to two or more superimposed printed circuit boards within the same apparatus.

Accordingly, it is a primary object of this invention to provide a lightweight, high reliability socket for use on miniaturized apparatus and printed circuits.

Another object of this invention is to provide a socket capable of making contact with two or more superimposed circuit boards so that electrical coupling between circuits may be adequately isolated and shielded.

A further object of this invention is to provide a socket having an inherent float for the purpose of self-alignment with rigidly secured module connector pins, while maintaining permanent electrical and mechanical connection with the interwired, etched or printed circuit boards.

Still another object of this invention is to provide a socket with contact configuration completely flexible to comply with modules of varying dimensions and contact quantities.

Additional objects, advantages and features of the invention reside in the construction, arrangement and combination of parts involved in the embodiment of the invention as will appear from the following description and accompanying drawings, wherein.

The socket referred to generally as socket 10 is preferably made of suitable strip material such as beryllium copper, which after being die formed, may be heat treated and plated with corrosion resistant materials such as silver and gold.

Figure 2:
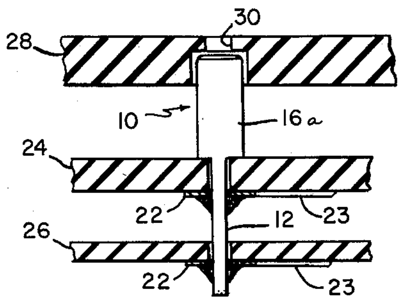
FIG. 2 is a side elevation of the socket with circuit boards and outer panel in section.
Figure 3:
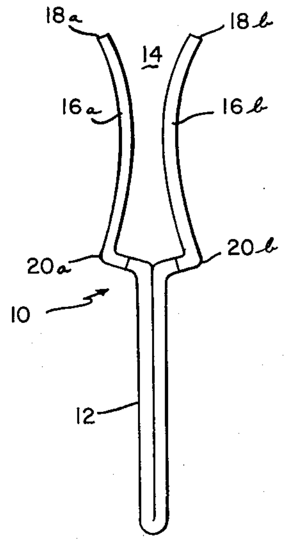
FIG. 3 is an enlarged, vertical view of the socket to more clearly show construction details.

The socket is made by folding two symmetrically opposite halves to form a tail 12 and a fork 14 as most clearly shown on FIG. 3. Fork 14 comprises two symmetrically opposite tines **16*a* and 16*b*, each of arcuate form and with the convex sides opposing each other as shown. The tines are in such spaced relationship with each other that the space between them in their free position is somewhat less than the diameter of the pin to be inserted. The tines terminate in ends 18*a* and 18*b* which are useful for a purpose to be hereinafter described. The bases of the tines consist of heels 20*a* and 20*b*, adjacent to and on each side of tail 12, which are also useful for a purpose to be hereinafter described. The tail 12 may be made somewhat narrower than the tines 16*a* and 16*b***, as shown on FIG. 2, in order to enter the terminal ring end of a printed element on a circuit board.

Figure 1:
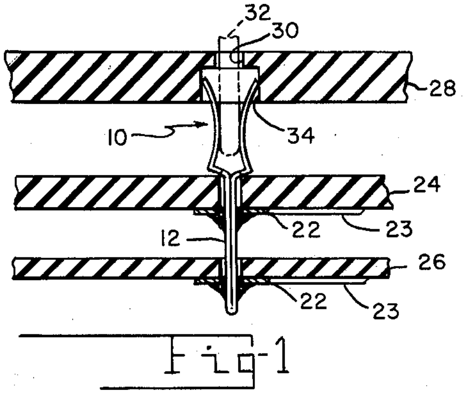
FIG. 1 is an elevation of the socket with the circuit boards and outer panel in section, and showing the socket soldered to the printed circuits on two circuit boards, and showing in the outer panel member, the cavity forming the support surfaces for the fork extremities of the socket.

Referring to FIG. 1, socket 10 is shown soldered to ring ends 22 of circuit elements 23 printed on circuit board 24 and circuit board 26. The tail 12 of the socket passes through holes in the circuit boards which are large enough to permit float for the purpose of allowing the socket to self-align with a rigidly secured module pin. The socket is soldered in place with the heels **20*a* and 20*b* resting against the top face of circuit board 24**.

Circuit board 24 is in superimposed relationship with outer panel 28 of the electrical apparatus as shown on FIG. 1. Outer panel 28, which is of a dielectric material, has a hole 30 somewhat larger in diameter than connector pin 32 which is to be inserted into the socket. The inner face of outer panel 28 has a cavity 34 which may be of circular, square or other convenient form, the sides of which provide a bearing surface for the ends **18*a* and 18*b* of fork 14 when connector pin 32** is inserted into the socket. The provision of bearing surfaces to support the ends of the fork when the pin is inserted into the socket, assures a unique socket with exceptional pin holding ability.

Figure 4:
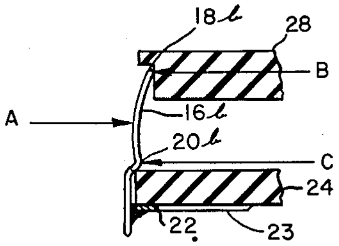
FIG. 4 is a partial vertical section of the socket showing the forces acting on the fork when a pin is inserted into the socket.

The action of the socket is best shown on FIG. 4 depicting the right tine **16*b* only. The action of the left tine 16*a*** is the same as the action of the right tine and need not be shown. It is noted on FIG. 4 that, unlike most sockets which have cantilever action, the present invention has a bridge action between the heel and end of each tine. As the pin commences to enter the fork, the ends of the tines are brought to bear against the sides of the cavity. Further insertion of the pin applies pressure to the mid portion of each tine as shown by arrow A on FIG. 4. The pressure applied in the direction of arrow A is resisted by opposing force as represented by arrows B and C.

Within the elastic limits of the material from which the socket is made, the deflection of the tines is proportional to the applied force. From this, it is noted that the amount of retaining pressure applied to a pin may be controlled by establishing the size relationship between the elements.

Experience has shown that with pins and sockets of the size range contemplated in the embodiment of the invention disclosed, a combined deflection of .020 inch when using a .040 inch diameter pin produced excellent results. As previously noted, the design of the socket is such as will permit self-alignment with a rigidly secured module pin. The deflection of each tine need not be identical to produce the same combined deflection or the same holding force against the pin.

It is to be understood that the embodiment of the present invention as shown and described is to be regarded as illustrative only and that the invention is susceptible to variations, modifications and changes within the scope of the appended claim.

I claim:

A pin socket having one end soldered to the circuits on a plurality of circuit boards, with the opposite end in lateral supporting engagement with an outer panel of electrical apparatus in superimposed spaced relationship to the adjacent circuit board and adapted for receiving and releasably retaining a pin joined to an electrical component detachably pinned to the electrical apparatus and comprising: a metallic strip having symmetrically opposing ends with a narrow midportion and folded on itself at the midsection to form a tail at one end and an open end fork at the other end laterally symmetrical with the tail, the tail being formed of the narrow midportion and the open end fork being formed of the symmetrically opposite ends; the open end fork comprising a pair of inwardly curving arcuate tines each terminating at the base end in a heel at right angle to the arcuate surface and transforming the fork to the narrow tail and being spaced to provide a lateral gap at the nearest point between opposing tines which is less than the diameter of the pin to be received and retained, the tail of the socket passing through clearance holes in the superimposed circuit boards and passing through and being soldered to ring ends of the circuit elements on the circuit boards with the heels of the tines resting against the surface of the adjacent circuit board.

References Cited in the file of this patent

UNITED STATES PATENTS

| | | |
|---|---|---|
| 2,525,210 | Del Camp | Oct. 10, 1950 |
| 2,595,188 | Del Camp | Apr. 29, 1952 |
| 2,756,485 | Abramson et al. | July 31, 1956 |
| 2,774,014 | Henry | Dec. 11, 1956 |
| 2,840,793 | Sunko et al. | June 24, 1958 |
| 2,977,562 | Benson | Mar. 28, 1961 |
| 3,048,811 | Lock | Aug. 7, 1962 |

FOREIGN PATENTS

| | | |
|---|---|---|
| 215,277 | Australia | May 26, 1958 |
| 336,612 | Great Britain | Oct. 16, 1930 |